United States Patent
Cruz (10) Patent No.: US 7,184,899 B2
(45) Date of Patent: Feb. 27, 2007

(54) ENERGIZABLE ELECTRICAL TEST DEVICE FOR MEASURING CURRENT AND RESISTANCE OF AN ELECTRICAL CIRCUIT

(75) Inventor: Randy Cruz, La Habra, CA (US)

(73) Assignee: Power Probe, Inc, Brea, CA (US)

( * ) Notice: Subject to any disclaimer, the term of this patent is extended or adjusted under 35 U.S.C. 154(b) by 112 days.

(21) Appl. No.: 11/029,595

(22) Filed: Jan. 5, 2005

(65) Prior Publication Data
US 2006/0145714 A1 Jul. 6, 2006

(51) Int. Cl.
*G06F 3/02* (2006.01)

(52) U.S. Cl. ............ 702/57; 702/60; 702/64; 702/65

(58) Field of Classification Search ............ 702/60
See application file for complete search history.

(56) References Cited

U.S. PATENT DOCUMENTS

| | | | | |
|---|---|---|---|---|
| 4,034,291 A | * | 7/1977 | Allen et al. | 324/121 R |
| 4,114,095 A | * | 9/1978 | Pankove et al. | 324/121 R |
| 4,168,796 A | * | 9/1979 | Fulks et al. | 714/734 |
| 4,757,463 A | * | 7/1988 | Ballou et al. | 701/35 |
| 5,293,122 A | * | 3/1994 | Cake et al. | 324/754 |
| 5,359,290 A | * | 10/1994 | Cervas | 324/384 |
| 5,367,250 A | * | 11/1994 | Whisenand | 324/133 |
| 5,394,093 A | * | 2/1995 | Cervas | 324/556 |
| 5,511,108 A | * | 4/1996 | Severt et al. | 379/21 |
| 5,541,840 A | * | 7/1996 | Gurne et al. | 701/33 |
| 5,789,911 A | * | 8/1998 | Brass | 324/72.5 |
| 5,923,161 A | * | 7/1999 | Frankovitch et al. | 324/115 |
| 5,930,745 A | * | 7/1999 | Swift | 702/190 |
| 5,935,180 A | * | 8/1999 | Fieramosca et al. | 701/29 |
| 6,043,640 A | * | 3/2000 | Lauby et al. | 324/127 |
| 6,201,320 B1 | * | 3/2001 | Gallavan | 307/131 |
| D442,101 S | * | 5/2001 | Kochie | D10/78 |
| 6,448,779 B1 | * | 9/2002 | Beaver et al. | 324/504 |
| 6,459,968 B1 | * | 10/2002 | Kochie | 701/29 |
| 6,466,003 B1 | * | 10/2002 | Gallavan et al. | 324/115 |
| 6,501,277 B1 | * | 12/2002 | Sybesma | 324/503 |
| 6,512,361 B1 | * | 1/2003 | Becker | 324/133 |
| 6,608,486 B1 | * | 8/2003 | Betts | 324/503 |
| 6,794,859 B2 | * | 9/2004 | Choi | 324/115 |
| 6,812,685 B2 | * | 11/2004 | Steber et al. | 324/72.5 |
| D502,416 S | * | 3/2005 | Chen | D10/78 |

(Continued)

Primary Examiner—Marc S. Hoff
Assistant Examiner—Felix Suarez
(74) Attorney, Agent, or Firm—Stetina Brunda Garred & Brucker (57) ABSTRACT

Provided is an electrical test device having multi-meter functionality and being adapted to provide current sourcing to an electrical system for selective measurement of a plurality of parameters. The electrical test device comprises a conductor probe element, a power supply, a processor and a display device. The power supply is interconnected between an external power source and a probe element. The processor is connected to the probe element and is configured to provide an input signal to the electrical system and receive an output signal in response thereto. The output signal is representative of at least one of the parameters of the electrical system. The display device is configured to display reading the output signal which is representative of the parameter. The electrical device is configured to allow for selective powering of the electrical system upon energization of the probe element during measurement of the parameters.

27 Claims, 4 Drawing Sheets

U.S. PATENT DOCUMENTS

| | | | |
|---|---|---|---|
| 6,977,493 B2 * | 12/2005 | Novak et al. | 324/72.5 |
| 2002/0004694 A1 * | 1/2002 | McLeod et al. | 701/29 |
| 2002/0135349 A1 * | 9/2002 | Steber et al. | 324/72.5 |
| 2004/0041793 A1 * | 3/2004 | Redding et al. | 345/173 |
| 2004/0150383 A1 * | 8/2004 | Blais | 324/73.1 |
| 2004/0239308 A1 * | 12/2004 | Fazzina | 324/99 D |
| 2005/0052186 A1 * | 3/2005 | Grube | 324/503 |
| 2005/0200346 A1 * | 9/2005 | Novak et al. | 324/72.5 |
| 2006/0043959 A1 * | 3/2006 | Cavoretto | 324/72.5 |

* cited by examiner

ENERGIZABLE ELECTRICAL TEST DEVICE FOR MEASURING CURRENT AND RESISTANCE OF AN ELECTRICAL CIRCUIT

CROSS-REFERENCE TO RELATED APPLICATIONS (Not Applicable)

STATEMENT RE: FEDERALLY SPONSORED RESEARCH/DEVELOPMENT (Not Applicable)

BACKGROUND OF THE INVENTION

The present invention relates to electrical test equipment and, more particularly, to an electrical test device adapted to apply power to and perform multiple measurements upon an electrical system in the powered state.

Motor vehicles such as automobiles and trucks are becoming increasingly technologically sophisticated requiring a correspondingly more sophisticated set of test equipment for maintenance and diagnostic testing. Much of the increased complexity of motor vehicles is due in part to the increased complexity of electrical circuitry and systems incorporated therein. Troubleshooting and diagnosing problems with such electrical systems requires the use of a wide array of complex test equipment.

Such test equipment may include, for example, devices commonly referred to as multi-meters and which are configured to measure resistance, voltage, and current and more. Other diagnostic testing that is typically performed on motor vehicle electrical systems includes logic probes which measure and detect the presence and polarity of voltages as well as determining the continuity in electrical circuits. Unfortunately, such logic probes typically are incapable of measuring specific voltage levels.

Another drawback associated with prior art test equipment regards the inability to test such electrical systems in the powered state. More specifically, many existing multi-meters and logic probes are incapable of diagnosing problems with the circuitry in the operating mode such as testing electrical systems of a motor vehicle in the inoperative state. For example, certain electrical devices in the electrical system of an automobile having a non-operational engine cannot be tested in the normal operating mode. However, it may be desirable to test such devices in the operational mode in order to ascertain the specific problems that can only diagnosed when such devices are operating. For example, a fan motor of a motor vehicle may require that the engine of the vehicle is operating in order to provide current to the fan motor. Unfortunately, unless power is provided to the fan motor using a separate power source, it is impossible to test and diagnose certain problems with the fan motor.

As can be seen, there exists a need in the art for an electrical test device that is capable of providing power to an electrical system in order to test such electrical system in the active or powered state. Furthermore, there exists a need in the art for an electrical test device that combines other test features such as logic probe diagnostic testing into a single unit. In addition, there exists a need in the art for an electrical test device capable of combining key measurement functions into a single instrument in order to the accelerate diagnosis of electrical problems. Finally, there exists a need in the art for an electrical test device that is hand held, and that is easy to use and which contains a minimal number of parts and is of low cost.

BRIEF SUMMARY OF THE INVENTION

Provided is a uniquely configured electrical test device that is specifically adapted to provide current sourcing to an electrical system while also providing multi-meter functionality for selective measurement of a plurality of parameters of the electrical system under test. In addition to functions commonly performed by multi-meters, the electrical test device includes the capability to characterize loaded impedance, wave form and current drain. The unique configuration of the electrical test device eliminates the need for a clip-on current sensor as may be used in prior art electrical test devices to measure A.C. and D.C. current in a current carrying conductor of the electrical system under test. In addition, the unique configuration of the electrical test device eliminates the need for a separate power cable and probe element connection.

In its broadest sense, the electrical test device comprises a conductive probe element, a power supply, a processor and a display device. The electrical test device is configured to allow for selective powering of an electrical system upon energization of the probe element while parameters of the electrical system are being measured. The conductive probe element is configured to be placed into contact with the electrical system under test and to provide an input signal to the electrical system. The power supply is interconnected between an external power source, such as a vehicle battery, and the probe element.

The power supply is preferably configured to provide a voltage regulated output for all circuitry within the electrical test device. The processor controls all the functions of the electrical test device and is electrically connected to the probe element. The processor is configured to manipulate the input signal provided to the electrical system and to receive an output signal in response to the input signal. The output signal is representative of the measurement of at least one of the parameters of the electrical system.

The display device is configured to display a reading of the output signal extracted from the electrical system under test. The reading is representative of the parameter being measured. An audible device (i.e., a speaker) may be included within the electrical test device for providing an audible indication (i.e., a tone) of the parameter being measured. The electrical device will automatically switch between an active mode and a passive mode wherein the active mode is defined by measurement of the parameters during powering of the electrical system under test. The passive mode is defined by measurement of the parameters of the electrical system without the application of power. Switching between the active and passive modes, as well as manipulation of the electrical test device in general, may be controlled by a keypad which is connected to the processor.

In addition, the electrical test device may include a lamp which indicates proper powering of the electrical test device. In addition, the lamp may be operative to alert the user of a blown fuse of the electrical test device. The electrical test device features functionality as a dual continuity tester, load impedance detector, logic probe detector and generator, frequency and totalizer measurement, voltage measurement and current measurement. Due to its unique configuration, the electrical test device can simultaneously measure current and voltage of the electrical system due to the application of current sourcing into the electrical system under test.

BRIEF DESCRIPTION OF THE DRAWINGS

These as well as other features of the present invention will become more apparent upon reference to the drawings wherein.

DETAILED DESCRIPTION OF THE INVENTION

Referring now to the drawings wherein the showings are for purposes of illustrating various aspects of the invention and not for purposes of limiting the same, provided is a uniquely configured electrical test device 10 that is specifically adapted to provide current sourcing to an electrical system while also providing multi-meter functionality for selective measurement of a plurality of parameters of the electrical system. Advantageously, the electrical test device 10 is uniquely configured to allow for the collection of data on active, even on relatively high-current, electrical systems.

More specifically, the electrical test device 10 is specifically configured to allow access to current flow through the electrical system and includes the capability to characterize loaded impedance, wave form (e.g., fluctuation, frequency/speed), and current drain in addition to functions commonly performed by multi-meters such as voltage, current and resistance measurements. As was earlier mentioned, the unique configuration of the electrical test device 10 eliminates the need for clip-on current sensors as may be required in prior art electrical test devices. In addition, the unique configuration of the electrical test device 10 eliminates the need for a separate power cable and probe element connection.

Figure 1:
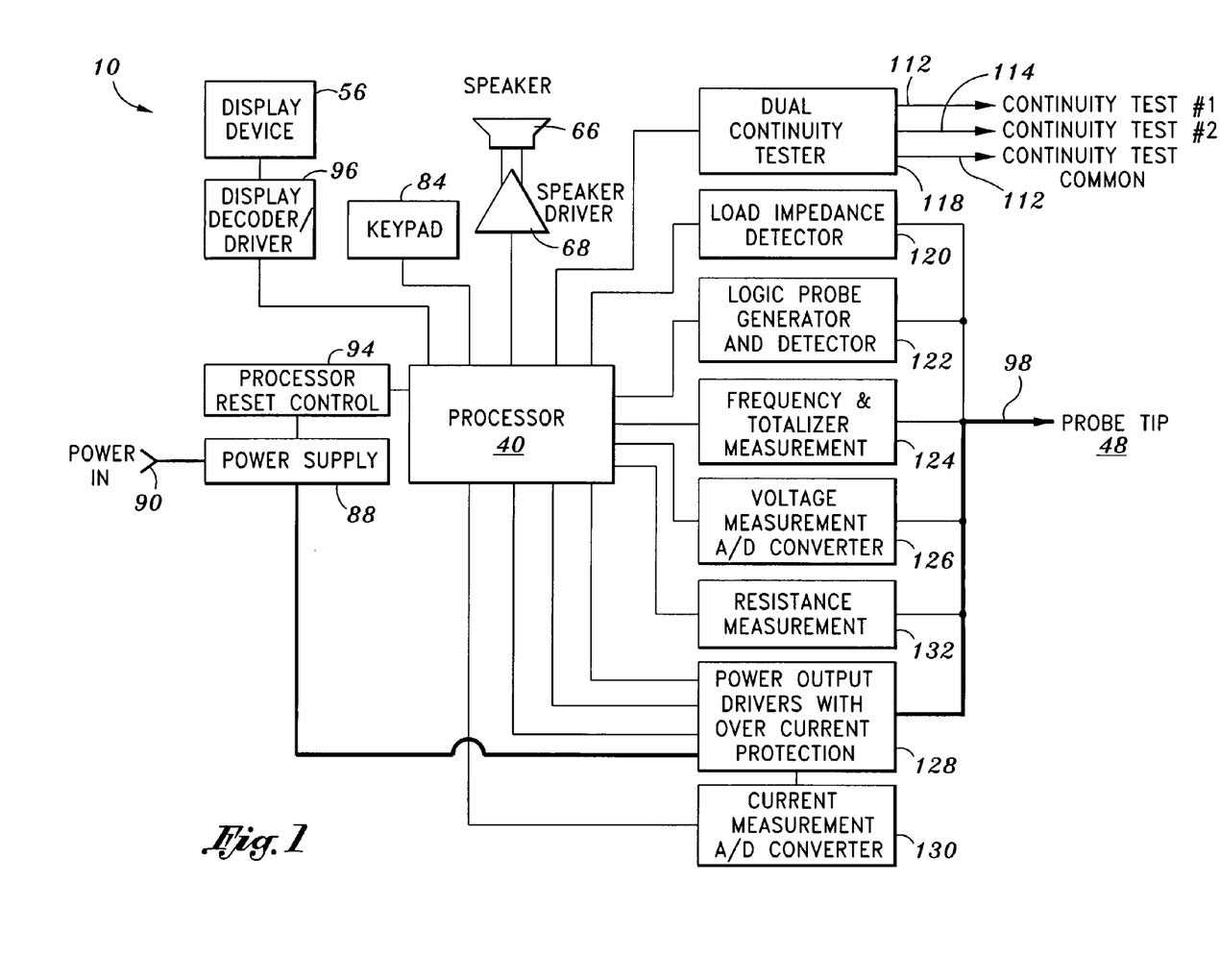
FIG. 1 is a block diagram of an electrical test device of the present invention and illustrates a power supply, a microprocessor, a display device, a keypad, and an energizable probe element that make up the electrical test device.

In its broadest sense, the electrical test device 10 comprises a conductive probe element 50, a power supply 88, a processor 92 and a display device 54. Importantly, the electrical test device 10 is configured to allow for selective powering of the electrical system under test upon energization of the probe element 50 while parameters of the electrical system are being measured. Referring to FIG. 1, shown is the block diagram of the electrical test device 10. As can be seen, the block diagram illustrates several functional blocks that indicate the various measurement capabilities of the test device 10. Each of the functional blocks is under control of the processor 92 which, as is shown in FIG. 1, may be configured as a microprocessor 40.

Referring now more particularly to FIG. 1, shown is the conductive probe element 50 which is configured to be placed into contact with the electrical system under test. In addition, the conductor probe element 50 is configured to provide an input signal to the electrical system. The power supply 88 is interconnected between an external power source 90 and the probe element 50. The power source may be configured as a battery of a motor vehicle which includes the electrical system under test. However, the external power source 90 may be configured in a variety of embodiments other than a motor vehicle battery.

Referring still to FIG. 1, the power supply 88 is connected to a reset control 94 such as a microprocessor reset control 94. The microprocessor reset control 94 may be comprised of circuitry that provides a reset signal to the processor 92 or microprocessor 40 under conditions wherein the operating voltage may be out of tolerance. As was earlier mentioned, the power supply 88 is connected to the external power source 90. The power supply 88 is preferably configured to provide a voltage regulated output for all circuitry within the electrical test device 10. Preferably, the voltage regulated output is provided independent of any input signal to the electrical system under test.

As can be seen in FIG. 1, the microprocessor reset control 94 is electrically connected to the processor 92 or microprocessor 40. The processor 92 or microprocessor 40 is electrically connected to the probe element 50 and is configured to manipulate the input signal provided to the electrical system and to receive an output signal in response to the input signal. The output signal is representative of the measurement of at least one of the parameters of the electrical system. In manipulating and controlling the electrical test device 10 measurement functions, the processor 92 or microprocessor 40 may be provided with an executable software program configured to provide control of the various measurement processes of the electrical test device 10. In this manner, the processor 92 or microprocessor 40 controls all the functions of the electrical test device 10.

As can be seen in FIG. 1, the electrical test device 10 includes the display device 54 which is electrically connected to the processor 92 or microprocessor 40 and which is configured to display a reading of the output signal which is extracted from the electrical system under test. The reading is representative of the parameter being measured. It should also be noted that an audible device may be included within the electrical test device 10 for providing an audible indication of certain operating parameters of the electrical system under test. For example, the audible device may comprise a piezo element 70 such as a piezo disk 74 which acts as a speaker 66 for providing information regarding continuity measurements and voltage polarity of the electrical system. As was earlier mentioned, the electrical test device 10 is specifically configured to allow for selective powering of the electrical system upon energization of the probe element 50 during measurement of the parameters of the electrical system.

The electrical device may be configured to automatically switch between one of an active mode and a passive mode wherein the active mode is defined by measurement of the parameters of the electrical system during powering thereof. As was previously mentioned, such power is ultimately supplied by an external power source 90 and which is directed through a power supply 88 and passed into the probe element 50. In this manner, the probe element 50 may transfer current into the electrical system under test. The passive mode is defined by measurement of the parameters of the electrical system without the application of power to the electrical system. The application of power may be controlled by a keypad 84 which is illustrated in FIG. 1 as being connected to a processor 92 or microprocessor 40.

In addition, the display device 54 such as a liquid crystal display 56 may be operative to indicate whether the test device 10 is in the passive mode or the active mode. As can be seen in FIG. 1, the electrical test device 10 may include a speaker driver 68 which is connected to the speaker 66 (i.e., the piezo element 70) and which handles the formatting and converting of signals from the processor 92 or microprocessor 40 such that the speaker 66 may be operated as necessary. In the same sense, the display driver 96, shown in FIG. 1 as being connected between the processor 92 or microprocessor 40 and the display device 54, is also operative to format and convert signals from the processor 92 or microprocessor 40 into a format needed for display by the display device 54.

Referring still to FIG. 1, shown are the functional blocks representative of the features of the electrical test device 10. Included with the functional blocks are dual continuity tester 118, load impedance detector 120, logic probe detector and generator 122, frequency and totalizer measurement 124, voltage measurement 126, resistance measurement 132, power output driver 128 with over current protection, and current measurement 130. The voltage measurement 126 functionality and the current measurement 130 functionality may each include analog-to-digital conversion mechanisms. Importantly, due to the unique configuration of the electrical test device 10 as illustrated in the block diagram, the electrical test device 10 can simultaneously measure current and voltage of the electrical system due to the application of current sourcing into the electrical system under test.

It should be noted that although each of the functional blocks is indicated as a separate block, componentry may be shared therebetween for facilitating any particular measurement of the electrical system. Furthermore, as can be seen, each of the functional blocks is connected to the processor 92 or microprocessor 40 which controls the operation of the electrical test device 10 during testing. It should also be noted that the dual continuity tester 118 functionality block shown in FIG. 1 may be used in conjunction with the current source provide by the probe when energized by the power supply 88. Such operation of the current source provided by the probe is similar to that which is disclosed in U.S. Pat. No. 5,367,250, issued to Whisenand ("the Whisenand reference") and which is entitled 64 "Electrical Tester With Electrical Energizable Test Probe", herein incorporated by reference in its entirety. The operation of the dual continuity tester 118 of the electrical test device 10 in combination with its signal lamps 58 provides for an extremely convenient means for testing the functionality of multi-pole relays. More specifically, the dual continuity tester 118 is configured to allow testing of multiple contacts with the pressing of a single button of the electrical test device wherein the coil resistance of the relay may be easily measured. In addition, many other test configurations may be obtained.

Likewise, the current sourcing functionality shown in FIG. 1 is similar to that shown and disclosed in the Whisenand reference. The dual continuity tester 118, when coupled with the measurement functions of the electrical test device 10, enables testing of contact switches in relay devices. For example, in an electrical system having two relays, the dual continuity tester 118 provides for the capability to determine which one of the two relays is activated and/or which is deactivated. In this manner, the dual continuity tester 118 allows for checking of relays using either a pair of signal lamps 58. When testing relays or switches in this manner, the speaker 66 is preferably configured to be inoperative to avoid producing audible signals that may otherwise impede detection of noises that are indicative of a functioning switch. Both the signal lamp 58 and/or the audible device may be used to provide an indication as to the activated or deactivated state of the relays. Furthermore, the dual continuity tester 118 may be used to check the status and operability of multiple contacts such as in a multi-pole/multi-contact relay or switch.

Referring still to FIG. 1, the load impedance detector 120 functional block allows for measurement of the magnitude of a voltage drop such as when testing electrical junctions in an electrical circuit. The load impedance detector 120 functional block is useful in testing power feed circuits that may have loose or corroded connections. As will be described in greater detail below, when the probe element 50 is connected to the electrical system under test, the impedance of the electrical system may be tested and the electrical test device 10 may provide an indication, either audibly via the speaker 66 and/or visually via the display device 54 (i.e., the LCD 56) such as when a set point (i.e., a predetermined voltage level) is above a specified voltage limit.

The logic probe generator and detector 122 functional block comprises a circuit that creates a sequence for outputting into a device of the electrical system through the probe element 50. For example, a digital pulse train may be inputted into a device of the electrical system with the digital pulse train inserted into a terminal of a device under test in order to assess communication between components of the electrical system (e.g., between an odometer in communication with a control unit of a motor vehicle). The logic probe generator and detector 122 functionality also provides the electrical test device 10 with a capability to measure signal levels as well as frequency. High and low logic levels may be generated as well as pulse trains at various frequencies.

The frequency and totalizer measurement 124 functional block allows the electrical test device 10 to assess the rate of voltage or current fluctuation in the electrical system under test, and to accumulate occurrences of a particular state over time. Circuitry of the frequency and totalizer measurement 124 block allow for processing of signal transition of a waveform in order to extract the frequency, revolutions per minute (RPM), duty cycle and number of pulses from a signal. The frequency aspect of the frequency and totalizer measurement 124 functional block allows for determining the frequency or RPM or duty cycle component of the electrical system. The totalizer aspect of the frequency and totalizer measurement 124 functional block accumulates pulses or cycles and allows the electrical test device 10 to measure and check for intermittent output signals from the electrical system under test. The frequency and totalizer measurement 124 functional block also provides a means for checking switches in an electrical system by providing a means for measuring the number of times that a contact within a switch bounces, for example, such as may occur in a relay switch.

The voltage measurement 126 block allows for high speed voltage measurement 126 in the electrical system. The voltage measurement 126 block represents the ability of the electrical test device 10 to sample and detect positive and negative peaks of a signal as well as detecting and measuring an average of the signals and displaying results of the signal readout on the display device 54. The voltage measurement 126 block simplifies voltage drop tests, voltage transient tests and voltage fluctuation or ripple tests. The power output driver 128 with over current protection functional block provides a buffer stage or a transistor for the electrical test device 10 such that the power output driver 128 with over current protection regulates the amount of current that may be passed from the power supply 88 to the probe element 50 and ultimately into the electrical system under test. In addition, the power output driver may establish an appropriate drive impedance and protect the electrical test device 10 from damage due to automotive transients. The current measurement 130 functional block allows for high speed current measurement 130 by the electrical test device 10 such that sampling and detection of current consumed in a load provided in the input signal which is passed into the electrical system. Such consumed current may be displayed on the display device 54.

Figure 2:
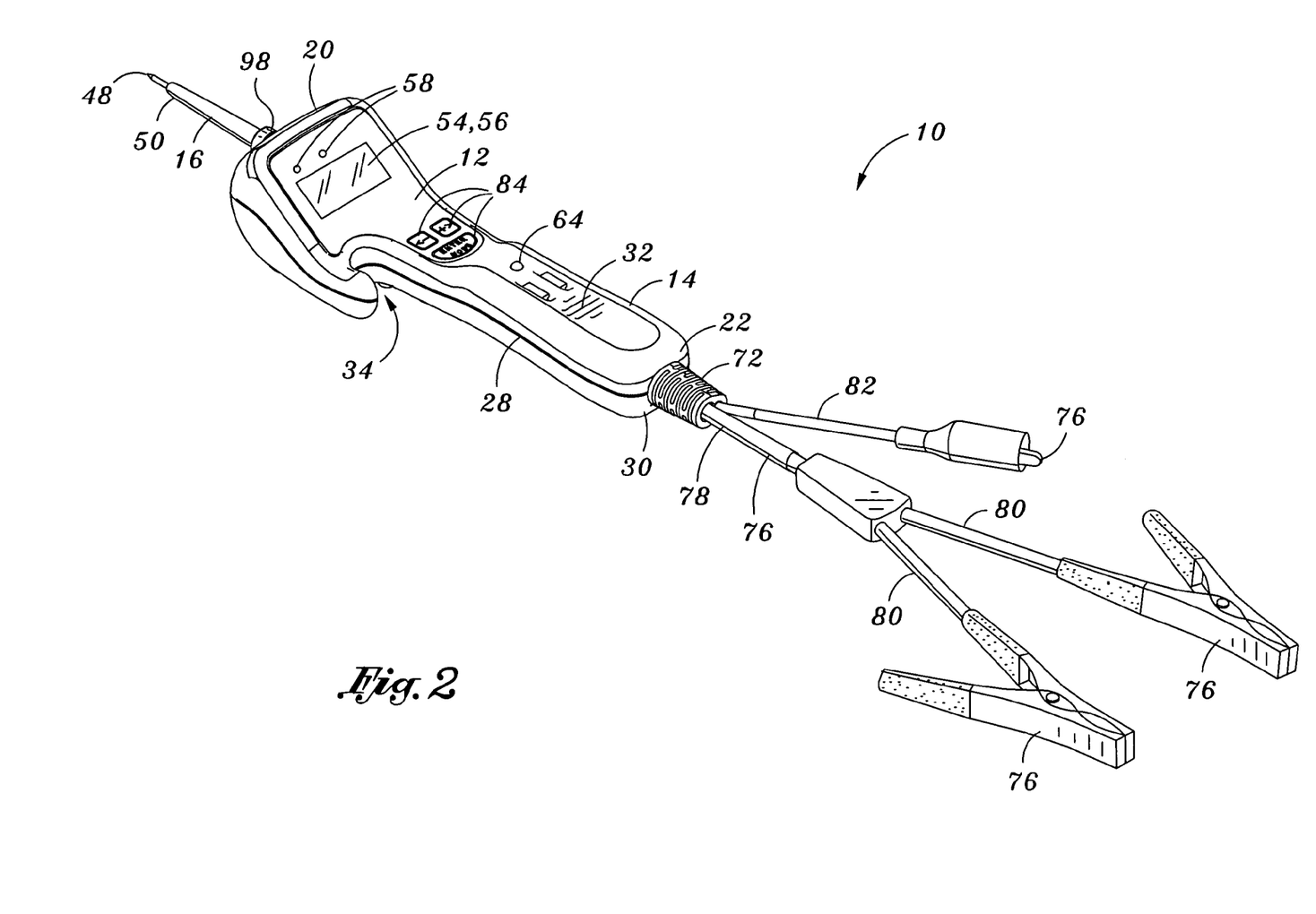
FIG. 2 is a perspective view of the electrical test device and illustrating a pair of power leads and a ground lead connected to a circuit board of the electrical test device.
Figure 3:
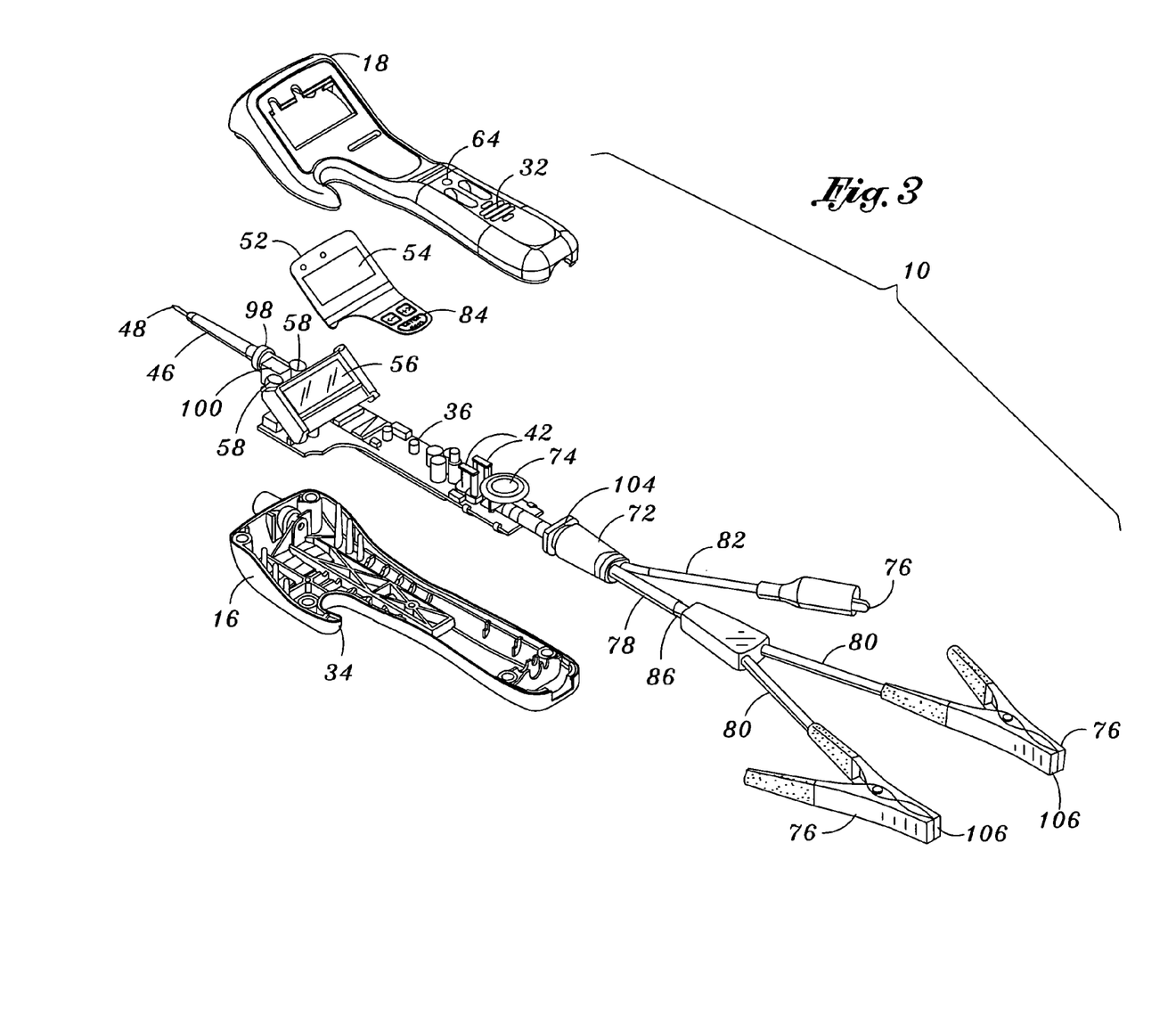
FIG. 3 is a partially exploded perspective view of the electrical test device illustrating a housing comprising upper and lower shells, a circuit board assembly contained within the housing, and the power cable and probe element extending out of the housing.

Referring now to FIGS. 2–5, shown is an embodiment of the electrical test device 10 schematically illustrated in FIG. 1. As best shown in FIGS. 2–3, the electrical test device 10 may include a housing 14 configured as a generally elongated, hollow, rectangular cross-sectionally shaped box. The housing 14 has a top end 20 and a bottom end 22. The top end 20 may be generally wider than a remaining portion of the housing 14 so that a display assembly 52 containing the display device 54 may be incorporated into the housing 14. The display device 54 may be supported with display supports 44 which may orient the display device 54 at a convenient angle for observation by an operator of the test device 10. The remaining portion of the housing 14 may have a narrower width to allow for single-hand operation of the test device 10.

Contained within the housing 14 is a circuit board assembly 36 comprising a circuit board 38 whereon a microprocessor 40 and display device 54 along with the power supply 88, microprocessor 40 reset control 94, speaker driver 68 and display driver 96 may be enclosed and interconnected. The housing 14 includes an upper shell 18 and a lower shell 16 which may be fastened to one another such as by mechanical fasteners. As can be seen in FIGS. 2 and 3, the housing 14 includes an upper wall 24 disposed with the upper shell 18 and a lower wall 26 disposed with the lower shell 16. In its assembled 64 state, the housing 14 includes opposing side walls 28 and opposing end walls 30. At the top end 20 of the housing 14 is an aperture formed therein and into which a probe jack 98 may be fitted. The probe element 50 is configured to be removably inserted into the probe jack 98. A probe overmold 46 may be provided to encase a major portion of the probe element 50.

At the bottom end 22 of the housing 14 is another aperture formed therein and through which a power cable 78 protrudes. The power cable 78 is configured with a pair of power leads 80, preferably one positive lead and one negative lead. In addition, a ground lead 82 may be also included in the power cable 78 extending out of the bottom end 22 of the housing 14. Both power leads 80 may be configured as insulated conductors as may be the ground lead. The cable 50 maybe encased in a cable sheathing 86 which passes through an annular shaped bushing 72 coaxially fitted within the aperture formed in the end wall 30 and which may prevent undue strain on the cable 50. The cable 50 includes a proximal end 104 which is disposed adjacent the housing 14 aperture and the strain relief bushing 72. The cable 50 also includes a distal end 106 having a pair of high power alligator clips 76 disposed on extreme ends of each one of the power leads 80.

As was earlier mentioned, the external power source 90 may be configured as a motor vehicle battery with the alligator clips 76 being configured to facilitate connection thereto. In this regard, the negative one of the power leads 80 may be provided in a black-colored alligator clip 76 while the positive one of the power leads 80 may be provided with a red-colored alligator clip 76. Disposed at an end of the ground lead 82 may also be an alligator clip 76 to facilitate connection to a ground source. As can be seen in FIG. 2, the upper and lower shells 16, 18 of the housing 14 are configured to provide a hang loop 34 extending out of one of the side wall 28. The hang loop 34 provides a mechanism by which the electrical test device 10 may be attached to or hung from fixed objects such as a cable or a hook.

As can be seen, the power cable 78 is electrically connected to the circuit board assembly 36. As was previously mentioned in the description of FIG. 1, the external power source 90 is connected via the power cable 78 to a power supply 88 which is integrated with the circuit board assembly 36 and which is ultimately connected to the probe element 50 extending out of the top end 20 of the housing 14. Included with the probe element 50 is a probe tip 48 on an extreme end thereof. Advantageously, the probe element 50 is configured to be removable from the electrical test device 10 via a probe jack 98 such that various electrical testing accessories may be plugged into the probe jack 98 for checking the electrical system under test.

Figure 5:
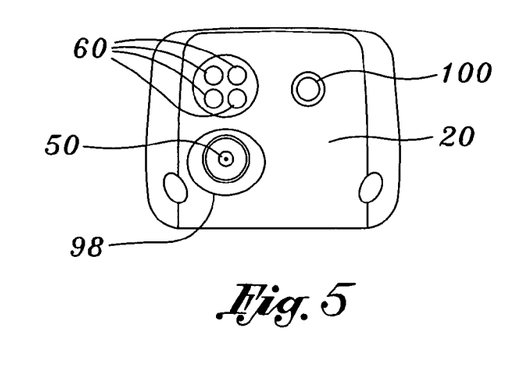
FIG. 5 is an end view of the electrical test device illustrating illuminating lamps, and an auxiliary jack formed within the housing for receiving the auxiliary cable.

Referring now to FIG. 5, shown is a front view of the electrical test device 10 and illustrating openings or apertures formed within the housing 14 through which illumination lamps 60 at least partially extend. The illumination lamps 60 may optionally be provided for illuminating an area adjacent to the test probe. Although four apertures and illumination lamps 60 are shown, any number may be provided. It is contemplated that the illumination lamp 60 or lamps may preferably be configured as light emitting diodes 64 (LED's). Activation and deactivation of the illumination lamps 60 may be provided by means of the keypad 84 which is electrically connected to the processor 92 or microprocessor 40 located on the circuit board 38 and which may be disposed at a location adjacent to the display device 54.

Figure 4:
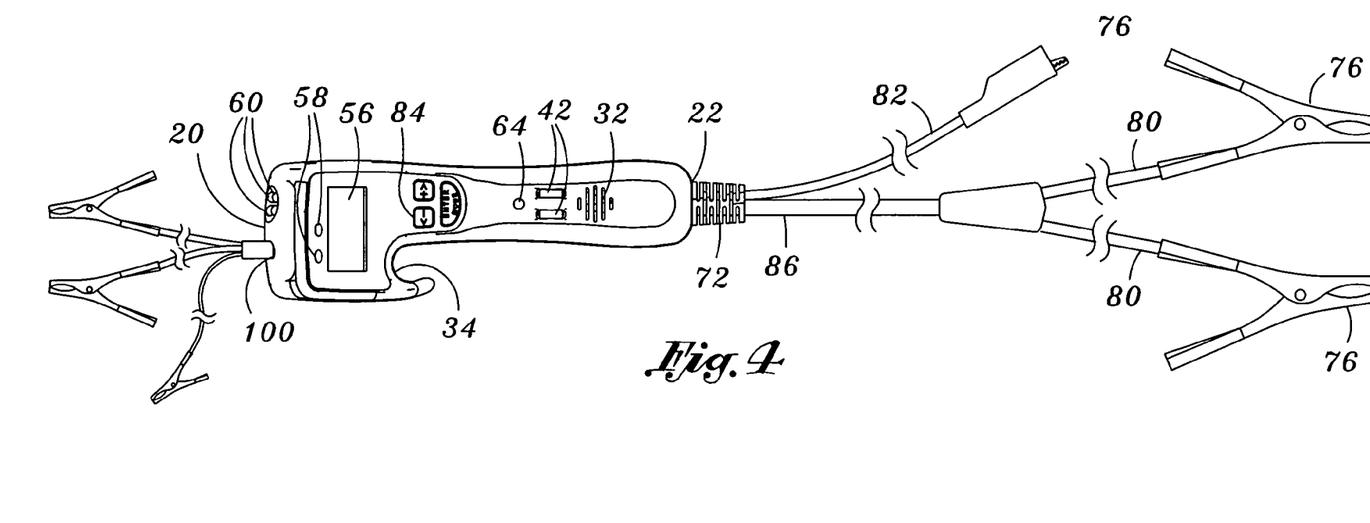
FIG. 4 is a top view of the electrical test device illustrating a keypad, a plurality of signal lamps, and speaker holes formed within the upper shell as well as an auxiliary cable connectable to the electrical test device.

Also shown in FIGS. 4–5 is an auxiliary jack 100 into which an auxiliary cable 102 may be inserted for facilitating continuity measurements as was described above with regard to the dual continuity tester 118 functionality block. The auxiliary cable 102 has a proximal end 104 and a distal end 106 and comprises a pair of auxiliary test leads 108 and the auxiliary ground lead 110. The auxiliary test leads 108 comprise a first continuity test lead 112 and a second continuity test lead 114. In addition, the auxiliary cable 102 may include an auxiliary ground lead 110 for use as a continuity test common ground 116. The auxiliary jack 100 formed within the housing 14 is electrically connected to the processor 92 or microprocessor 40. As was previously mentioned, the auxiliary ground and test leads 110, 108 are adapted to be selectively insertable into the auxiliary jack 100 at the proximal end 104.

Referring now to FIG. 3, mounted with the housing 14 is the display device 54 which may be configured as a liquid crystal display 56 (LCD). In order to protect the display device 54 as well as the interior of the housing 14, a display overlay 12 may be included and is preferably disposed generally flush or level with an upper wall 24 of the housing 14. In addition, the display overlay 12 may extend along the upper shell 18 to form a protective barrier for the keypad 84 integrated into the electrical test device 10. As was earlier mentioned, the keypad 84 allows for manipulation of the processor 92 or microprocessor 40 for controlling functionality of the electrical test device 10. The keypad 84 may be comprised of any number of keys but preferably may include three (3) buttons for operation of the electrical test device 10. The three (3) buttons of the keypad 84 may be preferably configured to allow for selective switching between different measurement modes of the electrical test device 10.

In addition, the keypad 84 may allow for the configuration of measuring and displaying various parameters of AC voltage and DC voltage measurements, resistance of the electrical circuit, current flowing within the electrical circuit, the frequency of signals, etc. More specifically, the electrical test device 10 may be manipulated such that parameters measurable by the electrical test device 10 include at least one of the following: circuit continuity, resistance, voltage, current, load impedance, and frequency, RPM and pulse counting. In addition, further measurement modes may be facilitated through manipulation of the keypad 84. For example, frequency, RPM, duty cycle and totalizer measurements may be provided upon an electrical circuit in a test. In addition, signal level and frequency may be measured as well as testing of impedance.

Referring still to FIG. 3, shown included with the circuit board assembly 36 may be at least one fuse 42 and preferably a pair of fuses 42 which partially protrude through apertures formed in the housing 14 at the upper shell 18. The fuses 42 are incorporated into the electrical test device 10 as a safety precaution to prevent damage to the circuitry of the test device 10. Also included with the electrical test device 10 may be a circuit breaker 62 such as an electronic circuit breaker 62 which may also have configurable trip levels and a manual circuit breaker reset. Also shown incorporated into the circuit board assembly 36 of the electrical test device 10 is a piezo element 70 which is shown configured as a piezo disk 74 and which is disposed adjacent the bottom end 22 of the housing 14.

Speaker holes 32 are shown formed in the upper shell 18 of the housing 14 to allow for transmission of audible tones generated by the piezo disk 74 such as may occur during the variously configurable modes of operation of the electrical test device 10. Also included with the circuit board assembly 36 may be an additional lamp configured as an LED 64 and which may protrude through an aperture formed in the upper shell 18 of the housing 14 as shown in FIGS. 2 and 3. Such LED 64 may be connected to the processor 92 or microprocessor 40 and may allow for providing a means to indicate whether power is being applied to the electrical test device 10. Alternatively, or in addition to, the LED 64 protruding through the upper shell 18 of the housing 14 may also be configured as a power-good indicator and to be de-activated to alert the user of a blown fuse 42.

Regarding the operation of the electrical test device 10, as was earlier discussed, the electrical test device 10 is operative in either one of the passive mode or the active mode. The passive mode is defined by measurements of the electrical system with no power being supplied thereto by the probe element 50. The active mode is defined by measurement of parameters of the electrical system during application of power such as from an external power source 90 through the probe element 50 and into the electrical system.

As was earlier discussed, the electrical test device 10 may be operated as a dual continuity tester 118 wherein the auxiliary cable 102 may be inserted into the auxiliary jack 100 at the top end 20 of the housing 14 as shown in FIG. 4. After insertion, the first continuity test lead 112 and second continuity test lead 114 as well as continuity test common ground 116 may be connected to the electrical system under test. In the active mode, wherein power is supplied to the electrical system under test, the continuity of a particular portion of the electrical system may be verified by using the auxiliary cable 102 comprising the first continuity test lead 112 and/or the second continuity test lead 114 in combination with the continuity test common ground 116.

As shown in FIG. 3, a pair of signal lamps 58 may be included with the test device 10 and may be positioned at the top end 20 of the housing 14 so as to protrude through apertures formed in the upper shell 18. The signal lamps 58 may be configured as LED's 64 and, more specifically, may be configured as a yellow LED and a red LED. In addition, as was previously mentioned, the piezo element 70 may be used in combination with or may be exclusively during continuity testing. Importantly, the dual continuity tester 118 may use the current source provided by the external power source 90 for inputting current into the electrical system during continuity testing.

Load impedance detection functionality may be facilitated such that the magnitude of a voltage drop within an electrical system such as when testing electrical junctions in power feed circuits that may have loose or corroded connections. The electrical system under test may be measured with differences there between being assessed and displayed on the display device 54. The logic probe generator and detection functional block, as was previously discussed, allows for testing for high logic, low logic and pulsing logic signals. The electrical test device 10 is configured to allow forcing of a signal into the electrical system under test with manipulation of multiple functions of the logic detection functionality such that an appropriate input signal may be injected into the electrical system under test.

The frequency and totalizer measurement 124 functionality allows for measuring signals from the electrical system as well as providing the capability for entering a "divide ratio", which may be equivalent to the number of cylinders of an engine within the motor vehicle being tested. In this manner, the electrical test device 10 may measure the revolutionary speed at which a motor vehicle engine is operating. In addition, as was previously discussed, rates of voltage or current fluctuation may be measured and signal transition components of a wave form may be analyzed to extract frequency, duty cycle and number of pulses. Regarding the voltage measurement 126 functionality, the electrical test device 10 may measure and display average voltage similar to that performed or measured by a standard volt meter as well as measurement and display of positive peak voltage and negative peak voltage. Importantly, the measurement of negative peak voltage enhances the ability to analyze and measure voltage of an alternator having a faulty diode.

The electrical test device 10 may be operated as a digital volt meter capable of performing a voltage drop test and battery load testing as well as transient voltage testing. In addition, the combination of the power output drivers 128 with current measurement 130 capability allows the electrical test device 10 of the present invention to measure current and voltage simultaneously. The electrical test device 10 may be placed in the active mode and can be placed in a "latched" or permanent operation mode wherein a constant supply of power is provided through the conductive probe element 50 into the electrical system under test. However, the electrical test device 10 can be placed in a "momentary" power mode wherein power may be supplied on an as-requested basis due to manual manipulation of one of the buttons of the keypad 84.

The processor 92 or microprocessor 40 may be configured to cause periodic energization of the probe element 50 for powering the electrical system under test at predetermined intervals for testing an electro-mechanical device that is part of the electrical system under test. Examples of electro-mechanical devices that may be tested in this manner include, but are not limited to, relay switches, solenoids, motors and various other devices. Power may be provided to the electrical system under test on an automatic intermittent basis at predetermined intervals such as, for example, at one-second intervals. Advantageously, the ability to provide power in such varying modes allows for testing the proper operation of electro-mechanical devices such as relay switches as well as in tracing locations of such electro-mechanical devices. By connecting the electrical test device 10 to the external power source 90 and intermittently providing current into the electrical system through the probe element 50, a user may more easily track the location of a faulty relay switch by listening for a clicking sound as power is intermittently applied thereto. Such method for checking for faulty relay switches may be especially valuable in detecting a relay switches that may be hidden underneath carpeting, seating and/or plastic molding commonly found in automotive interiors.

Additional modifications and improvements of the present invention may also be apparent to those of ordinary skill in the art. Thus, the particular combination of parts described and illustrated herein is intended to represent only certain embodiments of the present invention, and is not intended to serve as limitations of alternative devices within the spirit and scope of the invention.

What is claimed is:

1. An electrical test device having multimeter functionality and being adapted to provide current sourcing to an electrical system for selective measurement of a plurality of parameters thereof in at least one of powered and unpowered states, the electrical test device comprising:
    a conductive probe element configured to be placed into contact with the electrical system and provide an input signal thereto;
    a power supply interconnected between an external power source and the probe element;
    a processor electrically connected to the probe element and configured to manipulate the input signal provided to the electrical system and receive an output signal in response to the input signal, the output signal being representative of at least one of the parameters of the electrical system; and
    a display device electrically connected to the processor and configured to display a reading of the output signal, the reading being representative of the parameter;
    wherein the electrical test device is configured to allow for selective powering of the electrical system upon energization of the probe element during measurement of the parameters.

2. The electrical test device of claim 1 wherein:
    the electrical test device is configured to be switchable between one of an active mode and a passive mode;
    the active mode defined by measurement of the parameters during powering of the electrical system;
    the passive mode defined by measurement of the parameters without powering the electrical system.

3. The electrical test device of claim 1 further comprising:
    a housing having an auxiliary jack formed therein and being electrically connected to the processor; and
    an auxiliary cable having a proximal end and a distal end and comprising a pair of auxiliary test leads and an auxiliary ground lead;
    wherein the auxiliary ground and test leads being adapted to be selectively insertable into the auxiliary jack at the proximal end and connectable to the electrical system at the distal end for detecting continuity in the electrical system.

4. The electrical test device of claim 1 further comprising:
    a piezo element electrically connected to the processor;
    wherein the processor is configured to cause the piezo element to generate an audible tone during measurement of at least one of the parameters.

5. The electrical test device of claim 1 wherein the display device is a liquid crystal display.

6. The electrical test device of claim 1 further comprising a pair of power leads configured to connect the test device to the external power source.

7. The electrical test device of claim 6 wherein the external power source is a vehicle battery.

8. The electrical test device of claim 6 further comprising a ground lead configured to be connected to a ground source.

9. The electrical test device of claim 1 further comprising a keypad configured to allow for switching between measurement modes of the parameters.

10. The electrical test device of claim 1 wherein the parameters measurable by the test device include at least one of circuit continuity, resistance, voltage, current, load impedance and frequency.

11. An electrical test device having multimeter functionality and being adapted to provide current sourcing to an electrical system for selective measurement of a plurality of parameters thereof, the electrical test device comprising:
    a conductive probe element configured to be placed into contact with the electrical system and provide an input signal thereto;
    a power supply interconnected between an external power source and the probe element;
    a processor electrically connected to the probe element and configured to manipulate the input signal provided to the electrical system and receive an output signal in response to the input signal, the output signal being representative of at least one of the parameters of the electrical system; and
    a display device electrically connected to the processor and configured to display a reading of the output signal, the reading being representative of the parameter;
    wherein:
    the electrical test device is configured to allow for selective powering of the electrical system upon energization of the probe element during measurement of the parameters;
    the processor is configured to cause periodic energization of the probe element for powering the electrical system at predetermined intervals for testing a relay switch.

12. The electrical test device of claim 1 further comprising a pair of signal lamps connected to the processor and configured to illuminate in response to continuity measurement.

13. The electrical test device of claim 12 wherein the signal lamps are configured as light emitting diodes.

14. The electrical test device of claim 1 further comprising at least one illumination lamp connected to the processor and configured to illuminate an area adjacent the probe element.

15. The electrical test device of claim 14 wherein the illumination lamp is configured as a light emitting diode.

16. An electrical test device having multimeter functionality and being adapted to provide current sourcing to an electrical system for selective measurement of a plurality of parameters thereof, the test device being configured to be switchable between one of an active mode and a passive mode respectively defined by measurement of the parameters with and without powering of the electrical system, the test device comprising:

a conductive probe element configured to be placed into contact with the electrical system and provide an input signal thereto;

a power supply interconnected between an external power source and the probe element;

a processor electrically connected to the probe element and configured to manipulate the input signal provided to the electrical system and receive an output signal in response to the input signal, the output signal being representative of at least one of the parameters of the electrical system; and a display device electrically connected to the processor and configured to display a reading of the output signal, the reading being representative of the parameter;

wherein the electrical test device is configured to allow for selective powering of the electrical system upon energization of the probe element during measurement of the parameters.

17. The electrical test device of claim 16 further comprising:

a housing having an auxiliary jack formed therein and being electrically connected to the processor; and an auxiliary cable having a proximal end and a distal end and comprising a pair of auxiliary test leads and an auxiliary ground lead;

wherein the auxiliary ground and test leads being adapted to be selectively insertable into the auxiliary jack at the proximal end and connectable to the electrical system at the distal end for detecting continuity in the electrical system.

18. The electrical test device of claim 16 further comprising:

a piezo element electrically connected to the processor;

wherein the processor is configured to cause the piezo element to generate an audible tone during measurement of at least one of the parameters.

19. The electrical test device of claim 16 further comprising:

a pair of power leads configured to connect the test device to a vehicle battery; and a ground lead configured to be connected to a ground source.

20. The electrical test device of claim 16 further comprising a keypad configured to allow for switching between measurements of the parameters.

21. The electrical test device of claim 16 wherein the parameters measurable by the test device include at least one of circuit continuity, resistance, voltage, current, load impedance and frequency.

22. An electrical test device having multimeter functionality and being adapted to provide current sourcing to an electrical system for selective measurement of a plurality of parameters thereof, the test device being configured to be switchable between one of an active mode and a passive mode respectively defined by measurement of the parameters with and without powering of the electrical system, the test device comprising:

a conductive probe element configured to be placed into contact with the electrical system and provide an input signal thereto;

a power supply interconnected between an external power source and the probe element;

a processor electrically connected to the probe element and configured to manipulate the input signal provided to the electrical system and receive an output signal in response to the input signal, the output signal being representative of at least one of the parameters of the electrical system; and a display device electrically connected to the processor and configured to display a reading of the output signal, the reading being representative of the parameter;

wherein:

the electrical test device is configured to allow for selective powering of the electrical system upon energization of the probe element during measurement of the parameters;

the processor is configured to cause periodic energization of the probe element for powering the electrical system at predetermined intervals for testing an electro-mechanical device.

23. The electrical test device of claim 22 wherein the electro-mechanical device is a relay switch.

24. The electrical test device of claim 16 further comprising a pair of signal lamps connected to the processor and configured to illuminate in response to continuity measurement.

25. The electrical test device of claim 16 wherein the processor is configured to cause the speaker and the display device to simultaneously and respectively generate an audible signal and display a reading of the output signal.

26. The electrical test device of claim 16 further comprising:

a pair of power leads configured to be connected to the power source; and a ground lead configured to be connected to a ground source.

27. The electrical test device of claim 16 further comprising at least one signal lamp electrically connected to the processor and configured to receive the output signal therefrom and illuminate in response to detection of voltage polarity of the electrical system.

* * * * *